United States Patent
Yue et al.

(10) Patent No.: US 12,249,524 B2
(45) Date of Patent: Mar. 11, 2025

(54) TRANSFER STRUCTURE AND MANUFACTURING METHOD THEREOF, TRANSFER DEVICE AND MANUFACTURING METHOD THEREOF

(71) Applicant: BOE TECHNOLOGY GROUP CO., LTD., Beijing (CN)

(72) Inventors: Yang Yue, Beijing (CN); Tong Yang, Beijing (CN); Shi Shu, Beijing (CN); Yong Yu, Beijing (CN); Haitao Huang, Beijing (CN); Xiang Li, Beijing (CN); Qi Yao, Beijing (CN); Xue Jiang, Beijing (CN); Guangcai Yuan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1076 days.

(21) Appl. No.: 17/264,902

(22) PCT Filed: May 29, 2020

(86) PCT No.: PCT/CN2020/093140
§ 371 (c)(1),
(2) Date: Feb. 1, 2021

(87) PCT Pub. No.: WO2020/259199
PCT Pub. Date: Dec. 30, 2020

(65) Prior Publication Data
US 2021/0305073 A1      Sep. 30, 2021

(30) Foreign Application Priority Data
Jun. 26, 2019    (CN) .................... 201910560425.0

(51) Int. Cl.
H01L 21/67     (2006.01)
B65G 47/90    (2006.01)
(Continued)

(52) U.S. Cl.
CPC ........ *H01L 21/67144* (2013.01); *B65G 47/90* (2013.01); *H01L 25/0753* (2013.01);
(Continued)

(58) Field of Classification Search
None
See application file for complete search history.

(56) References Cited

U.S. PATENT DOCUMENTS 10,643,879 B2   5/2020  Hsu et al.
2009/0058231 A1* 3/2009 Matsumoto ............ B41J 2/1631
                                                                29/25.35
(Continued)

FOREIGN PATENT DOCUMENTS

CN    106229287 A    12/2016
CN    108281368 A     7/2018
(Continued)

OTHER PUBLICATIONS

Machine English translation of CN111599912A, Accessed May 30, 2024 (Year: 2020).*

*Primary Examiner* — Jacob T Minskey
*Assistant Examiner* — Adrianna N Knoves
(74) *Attorney, Agent, or Firm* — Chiwin Law LLC

(57) ABSTRACT

Provided in the embodiments are a transfer structure and a method thereof, and a transfer device and a manufacturing method thereof. The transfer structure includes: a first electrode, a piezoelectric layer, a second electrode and an adhesive layer stacked on a substrate in sequence, wherein the first electrode and the second electrode are insulated from each other. The transfer structure further includes: a position-limiting layer, wherein the position-limiting layer includes a cavity; the piezoelectric layer and at least part of the adhesive layer are located in the cavity of the position-limiting layer; and in the direction perpendicular to the
(Continued)

substrate, the distance between the surface, away from the substrate, of the position-limiting layer and the substrate is greater than the distance between the surface, away from the substrate, of the adhesive layer and the substrate.

16 Claims, 8 Drawing Sheets

(51) Int. Cl.
*H01L 25/075* (2006.01)
*H01L 33/62* (2010.01)
*H10N 30/00* (2023.01)
*H10N 30/074* (2023.01)
*H10N 30/20* (2023.01)
*H10N 39/00* (2023.01)

(52) U.S. Cl.
CPC ........... *H01L 33/62* (2013.01); *H10N 30/074* (2023.02); *H10N 30/206* (2023.02); *H10N 30/706* (2024.05); *H10N 39/00* (2023.02); *H01L 2933/0066* (2013.01)

(56) References Cited

U.S. PATENT DOCUMENTS

| | | |
|---|---|---|
| 2014/0064904 A1 | 3/2014 | Bibl et al. |
| 2018/0351030 A1 | 12/2018 | Goward |
| 2018/0358246 A1 | 12/2018 | Kobrin |
| 2019/0229002 A1 | 7/2019 | Ge et al. |

FOREIGN PATENT DOCUMENTS

| | | | |
|---|---|---|---|
| CN | 108461438 A | | 8/2018 |
| CN | 109727901 A | | 5/2019 |
| CN | 109789630 A | | 5/2019 |
| CN | 110265425 A | | 9/2019 |
| CN | 111599912 A | * | 8/2020 |

* cited by examiner

TRANSFER STRUCTURE AND MANUFACTURING METHOD THEREOF, TRANSFER DEVICE AND MANUFACTURING METHOD THEREOF

This application is a U.S. National Phase Entry of International Application No. PCT/CN2020/093140 filed on May 29, 2020, designating the United States of America and claiming priority to Chinese Patent Application No. 201910560425.0, filed on Jun. 26, 2019. The present application claims priority to and the benefit of the above-identified applications and the above-identified applications are incorporated by reference herein in their entirety for all purposes.

TECHNICAL FIELD

The present disclosure relates to a transfer structure and a manufacturing method thereof, a transfer device and a manufacturing method thereof.

BACKGROUND

Micro LED (micro light-emitting diode) displays have the advantages of low power consumption, high brightness, ultra-high resolution and color saturation, fast response speed, ultra-power saving (power consumption of a micro LED display is 10% of the power consumption of a liquid crystal display, and is 50% of the power consumption of an organic electroluminescent display), long life, high efficiency, adaptability to various sizes and seamless splicing and the like, thus becoming the most promising next-generation novel display technology at present.

At present, there are many difficult problems to be solved in a manufacturing process of a micro LED display. For example, one problem is how to transfer millions or even tens of millions of micron-level micro LED crystalline grains (also called u LED crystalline grains) to a circuit substrate correctly and efficiently.

SUMMARY

The embodiments of the present disclosure provide a transfer structure and a manufacturing method thereof, a transfer device and a manufacturing method thereof. The transfer structure and transfer device can be used for transferring micro LED crystalline grains.

At least one embodiment of the present disclosure provides a transfer structure, comprising: a first electrode, a piezoelectric layer, a second electrode and an adhesion layer which are sequentially stacked on a substrate; the first electrode and the second electrode being insulated from each other; the transfer structure further comprises a position-limiting layer, and the position-limiting layer comprises a cavity; wherein the piezoelectric layer and at least part of the adhesion layer are in the cavity of the position-limiting layer; and in a direction perpendicular to the substrate, a distance between a surface of the position-limiting layer away from the substrate and the substrate is greater than a distance between a surface of the adhesion layer away from the substrate and the substrate.

In some examples, the transfer structure further comprises a protruding structure arranged on a sidewall of the cavity of the position-limiting layer.

In some examples, in a direction perpendicular to the substrate, the protruding structure is located on a side of the adhesion layer away from the substrate.

In some examples, in the direction perpendicular to the substrate, a surface of the protruding structure away from the substrate and the surface of the position-limiting layer away from the substrate are in a same plane.

In some examples, the position-limiting layer and the protruding structure are integrally formed.

In some examples, in the direction perpendicular to the substrate, the cavity has an opening facing at least a side away from the substrate.

In some examples, the transfer structure further comprises a protective layer arranged between the second electrode and the adhesion layer.

In some examples, the transfer structure further comprises an elastic layer arranged on a side of the first electrode away from the piezoelectric layer.

At least one embodiment of the present disclosure further provides a transfer device, comprising a substrate and a plurality of transfer structures arranged on the substrate according to any example of the above.

In some examples, the substrate comprises a first substrate, a plurality of gate lines and a plurality of data lines which are arranged on the first substrate, the plurality of gate lines extend in a first direction and are sequentially arranged in a second direction, and the plurality of data lines extend in the second direction and are sequentially arranged in the first direction; the substrate further comprises a plurality of thin film transistors arranged on the first substrate; gate electrodes of the plurality of thin film transistors arranged in a same row and arranged in the first direction are electrically connected to a same gate line; and source electrodes of the plurality of thin film transistors arranged in a same column and arranged in the second direction are electrically connected to a same data line; one first electrode in one transfer structure is electrically connected to one drain electrode of the thin film transistor.

At least one embodiment of the present disclosure further provides a manufacturing method of a transfer structure, comprising: forming a position-limiting layer on a second substrate, wherein the position-limiting layer comprises a cavity; forming a first sacrificial layer in the cavity of the position-limiting layer; forming an adhesion layer at least in the cavity of the position-limiting layer; forming a second electrode and a piezoelectric layer on the adhesion layer sequentially, wherein the piezoelectric layer is in the cavity of the position-limiting layer; forming a first electrode on the piezoelectric layer; and removing the first sacrificial layer and the second substrate.

In some examples, in a direction perpendicular to the second substrate, the cavity has an opening facing at least the second substrate.

In some examples, forming the position-limiting layer on the second substrate comprises: forming a position-limiting layer film on the second substrate; patterning the position-limiting layer film to form the position-limiting layer on the second substrate, and simultaneously forming a protruding structure on a sidewall of the cavity of the position-limiting layer.

In some examples, the manufacturing method further comprising: before forming the second electrode and the piezoelectric layer on the adhesion layer sequentially, forming a protective layer on the adhesion layer.

In some examples, the manufacturing method further comprising: after forming the first electrode on the piezoelectric layer, forming an elastic layer on the first electrode.

At least one embodiment of the present disclosure further provides a manufacturing method of a transfer device, comprising: forming a first electrode, a piezoelectric layer and a second electrode which are stacked on a substrate sequentially; forming an adhesion layer on the second electrode, and forming a position-limiting layer on the substrate; the position-limiting layer comprising a cavity; wherein the piezoelectric layer and at least part of the adhesion layer are in the cavity of the position-limiting layer; a distance between a surface of the position-limiting layer away from the substrate and the substrate is greater than a distance between a surface of the adhesion layer away from the substrate and the substrate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

A micro LED display includes a circuit substrate and a plurality of micro LED crystalline grains arranged on the circuit substrate. Each micro LED crystalline grain can be driven to emit light independently, and each micro LED crystalline grain serves as an independent sub-pixel point. A size of each micro LED crystalline grain is micron level, and a volume of each micro LED crystalline grain is about 1% of a volume of an ordinary LED crystalline grain. One micro LED display includes millions or even tens of millions of micro LED crystalline grains. A manufacturing process of the micro LED display includes: first forming a plurality of micro LED crystalline grains on a carrying substrate, and then using a transfer device to transfer the plurality of micro LED crystalline grains on the carrying substrate to a circuit substrate.

Figure 1:
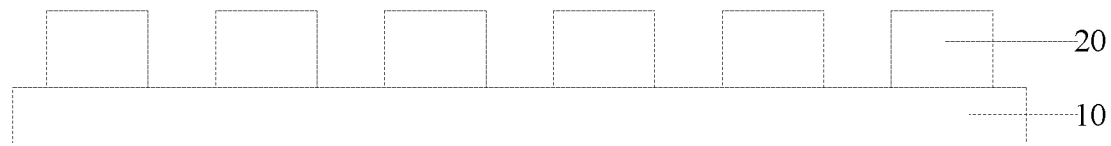
FIG. 1 is a schematic structural diagram of a transfer device according to an embodiment of the present disclosure.

An embodiment of the present disclosure provides a transfer device. As illustrated in FIG. 1, the transfer device includes a substrate 10 and a plurality of transfer structures 20 arranged on the substrate 10.

The transfer device provided by the embodiment of the present disclosure can be used to, but is not limited to transfer a plurality of micro LED crystalline grains on a carrying substrate to a circuit substrate, and can also be used to transfer other component to be transferred.

Hereinafter, the transfer structure 20 on the substrate 10 is described in detail.

As illustrated in FIGS. 2, 3, 4 and 5, the transfer structure 20 includes a first electrode 201, a piezoelectric layer 202, a second electrode 203 and an adhesion layer 204 which are sequentially stacked on a substrate 10. The first electrode 201 and the second electrode 203 are insulated from each other. The transfer structure 20 further includes a position-limiting layer 205, the position-limiting layer 205 includes a cavity. The piezoelectric layer 202 and at least part of the adhesion layer 204 are located in the cavity of the position-limiting layer 205. In a direction perpendicular to the substrate 10, a distance between a surface of the position-limiting layer 205 (i.e., the lower surface of the position-limiting layer 205 in FIG. 2-5) away from the substrate 10 and the substrate 10 is greater than a distance between a surface of the adhesion layer 204 away from the substrate 10 and the substrate 10.

The person skilled in the art should understand that the piezoelectric layer 202 has a positive piezoelectric effect and an inverse piezoelectric effect. The positive piezoelectric effect means that when the piezoelectric layer 202 is deformed by an external force in a certain direction, a polarization phenomenon occurs in the piezoelectric layer 202, and positive and negative charges appear on two opposite surfaces of the piezoelectric layer 202. When the external force is removed, the piezoelectric layer 202 restores to an uncharged state. This phenomenon is called as the positive piezoelectric effect. When a direction of the force changes, a polarity of the charge also changes. The inverse piezoelectric effect means that when an electric field is applied to the polarization direction of the piezoelectric layer 202, the piezoelectric layer 202 deforms, and after the electric field is removed, the deformation of the piezoelectric layer 202 disappears. This phenomenon is called as the inverse piezoelectric effect. The deformation of the piezoelectric layer 202 under an action of the electric field includes a thickness deformation type, a volume deformation type, and the like.

The transfer structure 20 in the embodiment of the present disclosure uses the inverse piezoelectric effect of the piezoelectric layer 202. When a voltage is applied to the first electrode 201 and the second electrode 203, the first electrode 201 and the second electrode 203 generate an electric field. The piezoelectric layer 202 is deformed under the action of the electric field. When the voltage applied to the first electrode 201 and the second electrode 203 is cut off, the electric field generated by the first electrode 201 and the second electrode 203 disappears, and the piezoelectric layer 202 restores to an original shape.

Figure 6:
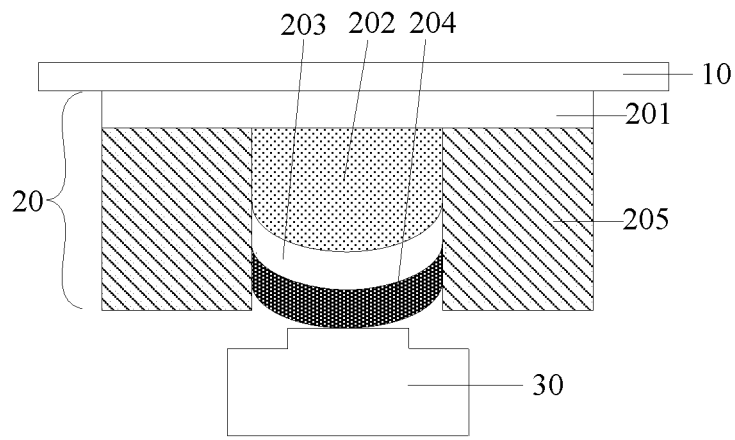
FIG. 6 is a schematic structural diagram of using a transfer structure to adhere a component to be transferred according to an embodiment of the present disclosure.
Figure 7:
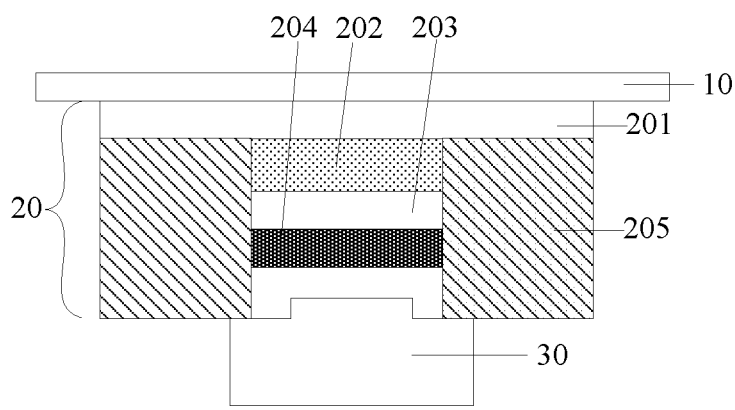
FIG. 7 is a schematic structural diagram of a transfer structure being separated from a component to be transferred according to an embodiment of the present disclosure.

The principle of the transfer structure 20 being used to transfer a component to be transferred, such as a micro LED crystalline grain, is as follows: when a voltage is applied to the first electrode 201 and the second electrode 203, as illustrated in FIG. 6, the piezoelectric layer 202 is deformed, so that the adhesion layer 204 located in the cavity of the position-limiting layer 205 is extruded out of the cavity of the position-limiting layer 205, and therefore, the adhesion layer 204 can pick up the component to be transferred. After the transfer structure 20 adhered with the component to be transferred moves the component to be transferred to a predetermined position, as illustrated in FIG. 7, the voltage applied to the first electrode 201 and the second electrode 203 is cut off, and the piezoelectric layer 202 restores to the original shape. At this time, the adhesion layer 204 extruded out of the cavity of the position-limiting layer 205 shrinks back into the cavity of the position-limiting layer 205. During a shrinking process of the adhesion layer 204, the position-limiting layer 205 blocks the component to be transferred from entering into the cavity of the position-limiting layer 205, so that the adhesion layer 204 is separated from the component to be transferred, thereby realizing transfer of the component to be transferred.

Based on the forgoing principle of the transfer structure 20 transferring the component 30 to be transferred, a size of the cavity of the position-limiting layer 205 can be set as required, a criterion is that the position-limiting layer 205 can block the component 30 to be transferred from entering into the cavity of the position-limiting layer 205 during the shrinking process of the adhesion layer 204.

For example, as illustrated in FIGS. 2-5, in a direction perpendicular to the substrate 10, the cavity has an opening facing at least a side away from the substrate 10, that is, the cavity has an opening at least facing the lower side of the figure. In this way, it is convenient to extrude the adhesion layer 204 from the lower opening. For another example, as illustrated in FIGS. 2-5, the cavity can also have openings facing upper and lower sides of the figure, that is, the cavity penetrates the position-limiting layer 205 in a direction perpendicular to the substrate 10.

Figure 2:
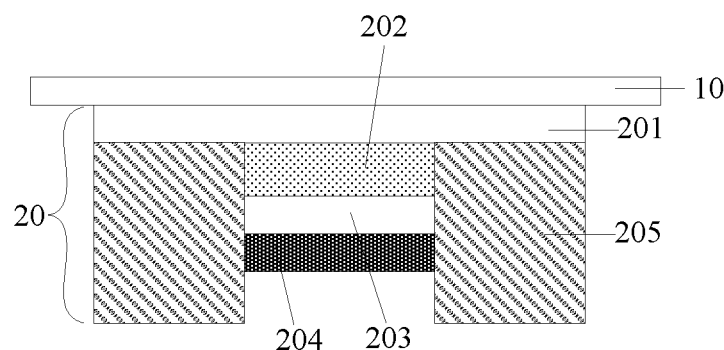
FIG. 2 is a schematic structural diagram I of a transfer structure according to an embodiment of the present disclosure.
Figure 4:
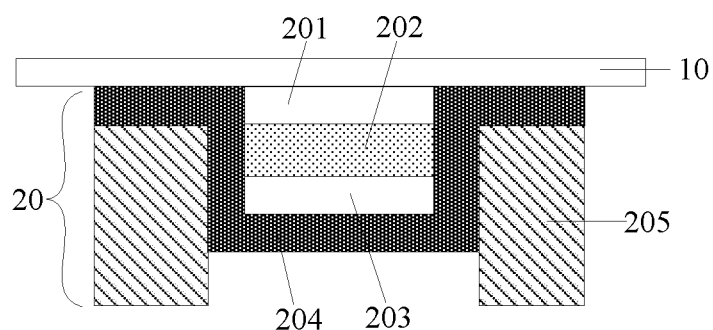
FIG. 4 is a schematic structural diagram III of a transfer structure according to an embodiment of the present disclosure.
Figure 5:
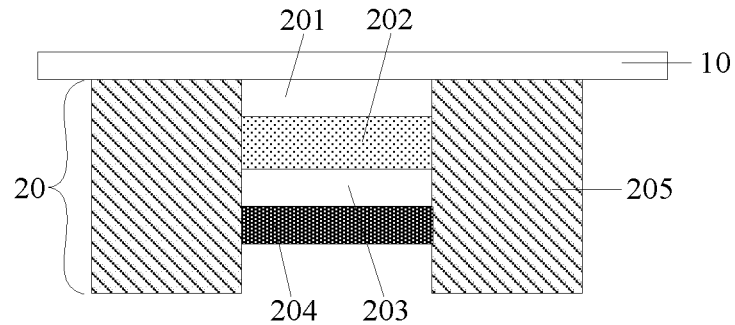
FIG. 5 is a schematic structural diagram IV of a transfer structure according to an embodiment of the present disclosure.

Here, it can be that, as illustrated in FIGS. 2 and 5, the adhesion layers 204 are all located in the cavity of the position-limiting layer 205. It can also be that, as illustrated in FIGS. 3 and 4, the adhesion layer 204 is partially located in the position-limiting layer 205 and partially located on a side of the position-limiting layer 205 close to the substrate 10.

Figure 3:
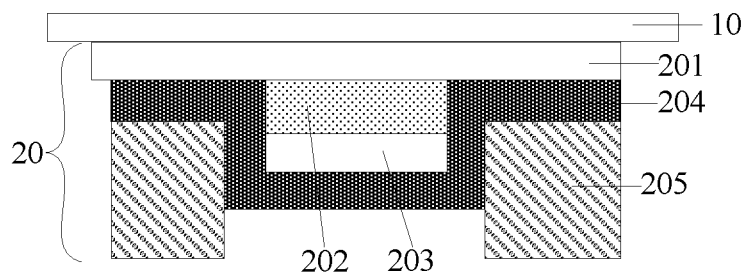
FIG. 3 is a schematic structural diagram II of a transfer structure according to an embodiment of the present disclosure.

In some embodiments, as illustrated in FIGS. 2 and 3, a boundary of an orthographic projection of the first electrode 201 on the substrate 10 surrounds a boundary of an orthographic projection of the cavity of the position-limiting layer 205 on the substrate 10. In some other embodiments, as illustrated in FIGS. 4 and 5, the boundary of the orthographic projection of the cavity of the position-limiting layer 205 on the substrate 10 surrounds the boundary of the orthographic projection of the first electrode 201 on the substrate 10. In the case that the boundary of the orthographic projection of the cavity of the position-limiting layer 205 on the substrate 10 surrounds the boundary of the orthographic projection of the first electrode 201 on the substrate 10, in some embodiments, as illustrated in FIG. 5, the first electrode 201 is located in the cavity of the position-limiting layer 205.

In some embodiments, the entirety of the second electrode 203 is located in the cavity of the position-limiting layer 205. In some other embodiments, the second electrode 203 is partially located in the cavity of the position-limiting layer 205 and partially located outside the cavity of the position-limiting layer 205.

A material of the position-limiting layer 205 is not limited, and is can be resin or metal, for example. When the material of the position-limiting layer 205 is metal, the position-limiting layer 205 cannot contact the first electrode 201 and the second electrode 203 at the same time.

Because the distance between the surface of the position-limiting layer 205 away from the substrate 10 and the substrate 10 is greater than the distance between the surface of the adhesion layer 204 away from the substrate 10 and the substrate 10, a distance between the surface of the position-limiting layer 205 away from the substrate 10 and the surface of the adhesion layer 204 away from the substrate 10 can be set as needed, so as to ensure that when the first electrode 201 and the second electrode 203 are applied with the voltage, after the piezoelectric layer 202 deforms, a criterion is that the adhesion layer located in the cavity of the position-limiting layer 205 204 can be extruded out of the cavity of the position-limiting layer 205.

Taking the component to be transferred being a micro LED crystalline grain as an example, a process of transferring a plurality of micro LED crystalline grains on the carrying substrate to the circuit substrate using the transfer device is described in detail below.

Figure 8:
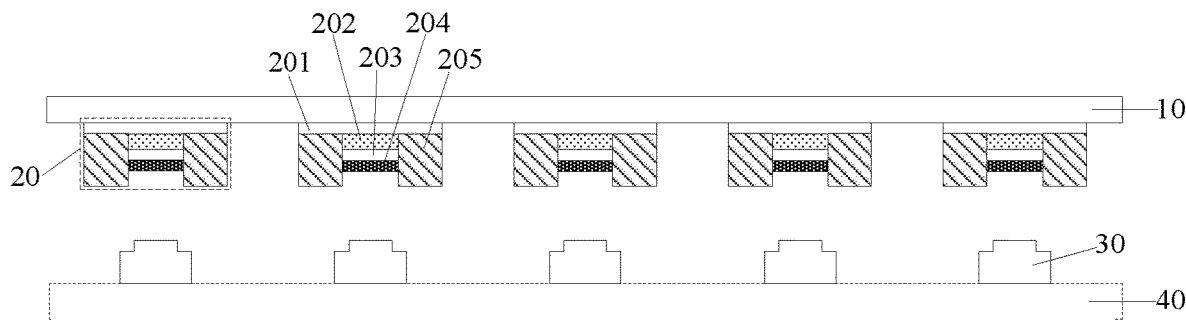
FIG. 8 is a schematic structural diagram illustrating a transfer structure in a transfer device directly opposite to a micro LED crystalline grain on a carrying substrate according to an embodiment of the present disclosure.
Figure 9:
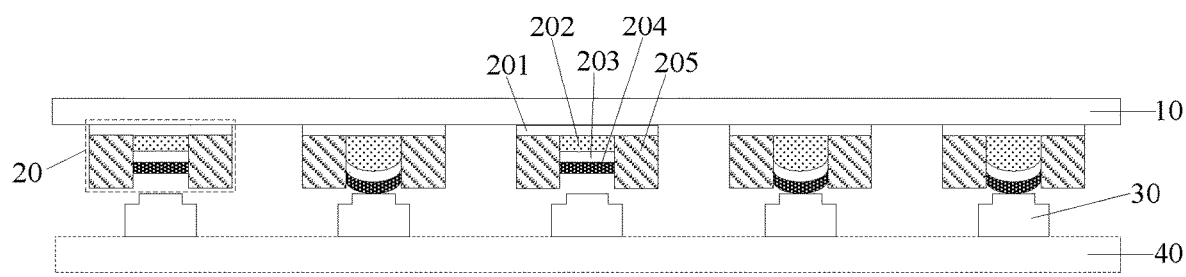
FIG. 9 is a schematic structural diagram illustrating a part of a transfer structure in a transfer device adhered with a micro LED crystalline grain according to an embodiment of the present disclosure.
Figure 10:
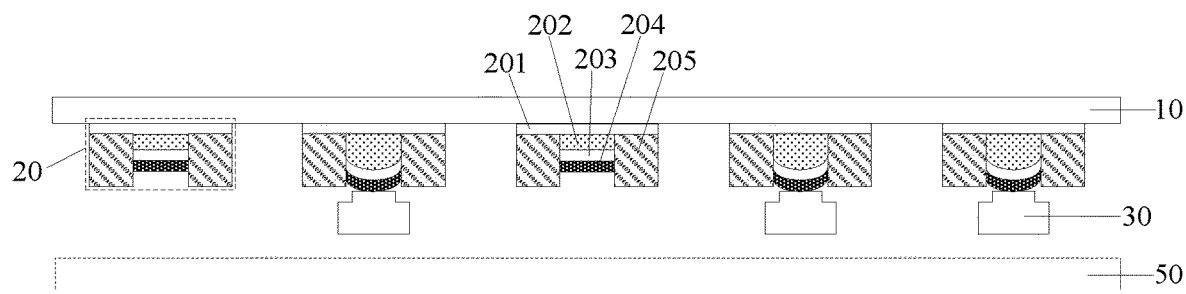
FIG. 10 is a schematic structural diagram illustrating a micro LED crystalline grain adhered on a transfer device directly opposite to a position where the micro LED crystalline grain is to be arranged on a circuit substrate according to an embodiment of the present disclosure.
Figure 11:
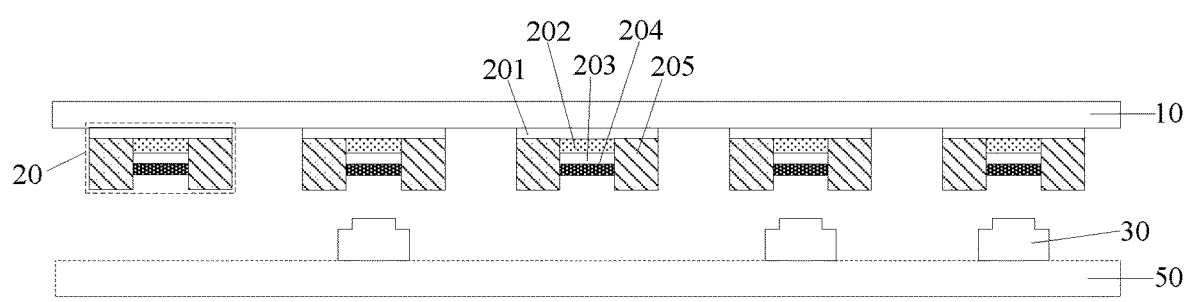
FIG. 11 is a schematic structural diagram illustrating a micro LED crystalline grain being transferred to a circuit substrate according to an embodiment of the present disclosure.

As illustrated in FIG. 8, the transfer device is moved above the carrying substrate 40, and one transfer structure 20 in the transfer device is directly opposite to one micro LED crystalline grain 30 on the carrying substrate 40. A voltage is applied to the first electrode 201 and the second electrode 203 of the transfer structure 20 opposite to the micro LED crystalline grain 30 to be transferred. After the voltage is applied to the first electrode 201 and the second electrode 203, the piezoelectric layer 202 is deformed, and the adhesion layer 204 is excluded out of the cavity of the position-limiting layer 205. As illustrated in FIG. 9, by moving the transfer device in a direction close to the carrying substrate 40, the adhesion layer 204 excluded out of the cavity of the position-limiting layer 205 can be adhered to the micro LED crystalline grain 30. As illustrated in FIG. 10, the transfer device to which the micro LED crystalline grain 30 is adhered is moved above the circuit substrate 50, and the micro LED crystalline grain 30 is directly opposite to a position on the circuit substrate 50 where the micro LED crystalline grain 30 is to be arranged. The voltage applied to the first electrode 201 and the second electrode 203 is cut off, the piezoelectric layer 202 restores to the original shape, the adhesion layer 204 that is excluded out of the cavity of the position-limiting layer 205 is shrunk into the cavity of the position-limiting layer 205. During a process that the adhesion layer 204 shrinks, the micro LED crystalline grain 30 is blocked by the position-limiting layer 205. As a result, the micro LED crystalline grain 30 is separated from the adhesion layer 204. As illustrated in FIG. 11, the micro LED crystalline grain 30 is transferred to the circuit substrate 50.

The forgoing process of "the transfer device is moved above the carrying substrate 40, and one transfer structure 20 in the transfer device is directly opposite to one micro LED crystalline grain 30 on the carrying substrate 40" can be, for example, that a first alignment mark pattern is provided on the substrate 10 and a second alignment mark pattern is provided on the carrying substrate 40, the first alignment mark pattern and the second alignment mark pattern are aligned, so as to realize a precision alignment of the transfer structure 20 and the micro LED crystalline grain 30.

The person skilled in the art should understand that after one transfer structure 20 in the transfer device is directly opposed to one micro LED crystalline grain 30 on the carrying substrate 40, the first electrode 201 and the second electrode 203 of the transfer structure 20 that is directly opposite to the micro LED crystalline grain 30 to be transferred are applied with a voltage, and no voltage is applied to the first electrode 201 and the second electrode 203 of the transfer structure 20 that is directly opposite to the micro LED crystalline grain 30 that does not need to be transferred, so that the adhesion layer 204 in the transfer structure 20 facing the crystalline grain 30 that does not need to be transferred will not adhere to the micro LED crystalline grain 30.

It should be noted that the embodiment of the present disclosure can use the forgoing steps to transfer all the micro LED crystalline grains 30 that need to be transferred on the carrying substrate 40 to the circuit substrate 50 at one time, or repeat the forgoing steps twice or more to transfer a plurality of micro LED crystalline grains 30 on the carrying substrate 40 to the circuit substrate 50. In a case that the plurality of micro LED crystalline grains 30 on the carrying substrate 40 include red-emitting micro LED crystalline grains, green-emitting micro LED crystalline grains and blue-emitting micro LED crystalline grains, the transfer device provided by the embodiment of the present disclosure and the forgoing transfer method can be used to transfer the red-emitting micro LED crystalline grains, the green-emitting micro LED crystalline grains and the blue-emitting micro LED crystalline grains, respectively.

An embodiment of the present disclosure provides a transfer device. The transfer device includes a substrate 10 and a plurality of transfer structures 20 arranged on the substrate 10. The transfer structure 20 includes a first electrode 201, a piezoelectric layer 202, a second electrode 203 and an adhesion layer 204 that are sequentially stacked on the substrate 10. The transfer structure 20 further includes a position-limiting layer 205, the position-limiting layer includes a cavity. The piezoelectric layer 202 and at least part of the adhesion layer 204 are located in the cavity of the position-limiting layer 205. In a direction perpendicular to the substrate 10, a distance between a surface of the position-limiting layer 205 away from the substrate 10 and the substrate 10 is greater than a distance between a surface of the adhesion layer 204 away from the substrate 10 and the substrate 10. Because the piezoelectric layer 202 is deformed when a voltage is applied to the first electrode 201 and the second electrode 203, the adhesion layer 204 located in the cavity of the position-limiting layer 205 can be excluded out of the cavity of the position-limiting layer 205. In this way, the adhesion layer 204 can be adhered to a component 30 to be transferred, such as a micro LED crystalline grain. After the transfer structure 20 to which the component to be transferred is adhered moves the component to be transferred to a predetermined position, the voltage applied to the first electrode 201 and the second electrode 203 is cut off, and the piezoelectric layer 202 restores to an original shape. At this time, the adhesion layer 204 excluded out of the cavity of the position-limiting layer 205 shrinks back into the cavity of the position-limiting layer 205. During a shrinking process of the adhesion layer 204, the position-limiting layer 205 blocks the component 30 to be transferred from entering into the cavity of the position-limiting layer 205, so that the adhesion layer 204 is separated from the component to be transferred, thereby realizing transfer of the component 30 to be transferred.

After the transfer structure 20 adhered with the component to be transferred moves the component 30 to be transferred to the predetermined position, a principle of separating the transfer structure 20 from the component 30 to be transferred is as follows: the voltage applied to the first electrode 201 and the second electrode 203 is cut off, and the piezoelectric layer 202 restores to the original shape. At this time, the adhesion layer 204 excluded out of the cavity of the position-limiting layer 205 shrinks back into the cavity of the position-limiting layer 205. During the shrinking process of the adhesion layer 204, because the position-limiting layer 205 blocks the component 30 to be transferred from entering into the cavity of the position-limiting layer 205, the component 30 to be transferred is separated from the adhesion layer 204, so that the component 30 to be transferred is separated from the transfer structure 20. Considering that if the position-limiting layer 205 is used to block the component 30 to be transferred from entering into the cavity of the position-limiting layer 205, when the component 30 to be transferred is the micro LED crystalline grain, a size of the micro LED crystalline grain is small, generally less than 50 μm. In order to ensure that the adhesion layer 204 is blocked by the position-limiting layer 205 during the shrinking process of the adhesion layer 204, when manufacturing the position-limiting layer 205, a size of the cavity of the position-limiting layer 205 is smaller than the size of the micro LED crystal grain. However, the size of the cavity of the position-limiting layer 205 is small, which increases a process difficulty of manufacturing the position-limiting layer 205.

Figure 12:
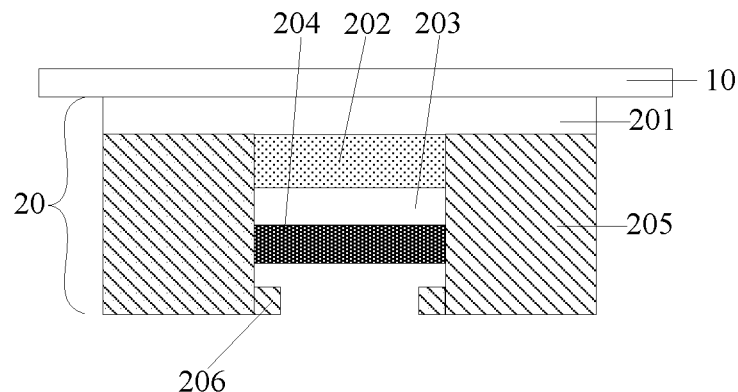
FIG. 12 is a schematic structural diagram V of a transfer structure according to an embodiment of the present disclosure.

Based on the foregoing, optionally, as illustrated in FIG. 12, the transfer structure 20 further includes a protruding structure 206 arranged on a sidewall of the cavity of the position-limiting layer 205. In a direction perpendicular to the substrate 10, the protruding structure 206 is located on a side of the adhesion layer 204 away from the substrate 10.

Here, the protruding structure 206 is equivalent to a position-limiting component.

Because the transfer structure 20 of the embodiment of the present disclosure further includes the protruding structure 206 provided on the sidewall of the cavity of the position-limiting layer 205, in a process that the voltage applied to the first electrode 201 and the second electrode 203 is cut off, and the piezoelectric layer 202 restores the original shape, and the adhesion layer 204 extruded out of the cavity of the position-limiting layer 205 shrinks back to the cavity of the position-limiting layer 205, the protruding structure 206 can block the component 30 to be transferred from entering into the cavity of the position-limiting layer 205, so that the adhesion layer 204 and the component 30 to be transferred can be separated. On this basis, because the component 30 to be transferred can be blocked from entering into the cavity of the position-limiting layer 205 by using the protruding structure 206, the size of the cavity of the position-limiting layer 205 can be made larger when manufacturing the position-limiting layer 205, thereby reducing difficulty of manufacturing the position-limiting layer 205.

In some embodiments, in the direction perpendicular to the substrate 10, the distance between the surface of the protruding structure 206 away from the substrate 10 and the substrate 10 is less than the distance between the surface of the position-limiting layer 205 away from the substrate 10 and the substrate 10. In some other embodiments, as illustrated in FIG. 12, in the direction perpendicular to the substrate 10, the surface of the protruding structure 206 away from the substrate 10 and the surface of the position-limiting layer 205 away from the substrate 10 (i.e., the lower surface of the position-limiting layer 205 in FIG. 12) are in the same plane.

In the embodiment of the present disclosure, when the piezoelectric layer 202 restores the original shape, and the adhesion layer 204 shrinks back into the cavity of the position-limiting layer 205, because the surface of the protruding structure 206 away from the substrate 10 and the surface of the position-limiting layer 205 away from the substrate 10 are in the same plane, the protruding structure 206 can more effectively block the component 30 to be transferred from entering into the cavity of the position-limiting layer 205, which is more conducive to the separation of the adhesion layer 204 and the component 30 to be transferred.

In some embodiments, the position-limiting layer 205 and the protruding structure 206 are integrally formed. In some other embodiments, the position-limiting layer 205 and the protruding structure 206 can be formed separately, and then the position-limiting layer 205 and the protruding structure 206 are fixed together.

In the embodiment of the present disclosure, when the position-limiting layer 205 and the protruding structure 206 are integrally formed, the position-limiting layer 205 and the protruding structure 206 can be simultaneously formed by using a patterning process, thereby simplifying a manufacturing process of the transfer structure 20.

Figure 13A:
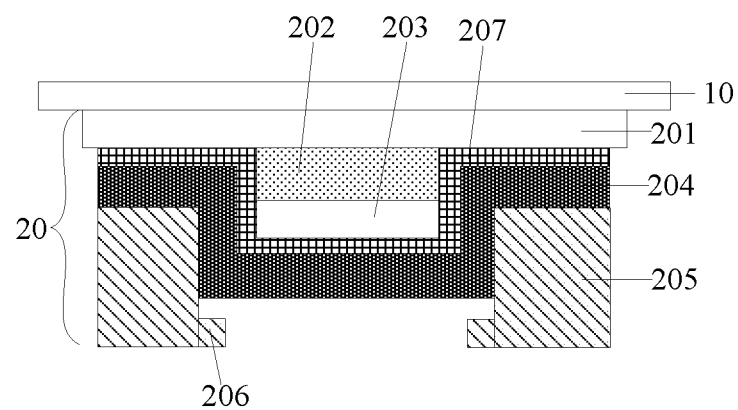
FIG. 13A is a schematic structural diagram VI of a transfer structure according to an embodiment of the present disclosure.

Optionally, as illustrated in FIG. 13A, the transfer structure 20 further includes a protective layer 207 arranged between the second electrode 203 and the adhesion layer 204.

In the embodiment of the present disclosure, because the transfer structure 20 further includes the protective layer 207 arranged between the second electrode 203 and the adhesion layer 204, the protective layer 207 can protect the second electrode 203, the piezoelectric layer 202, and the first electrode 201.

Figure 13B:
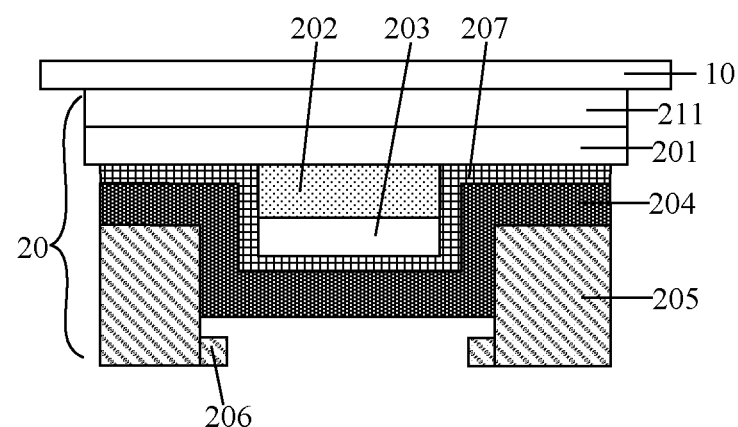
FIG. 13B is a schematic structural diagram VII of a transfer structure according to an embodiment of the present disclosure.

In some examples, as illustrated in FIG. 13B, the transfer structure 20 further includes an elastic layer 211 arranged on a side of the first electrode 201 away from the piezoelectric layer 202. The elastic layer 211 is used to connect the transfer structure 20 to the substrate 10 and play a role of supporting the transfer structure 20. The elastic layer 211 has elasticity, which is beneficial to reduce the interference of the substrate 10 to a deformation of the piezoelectric layer 202.

Figure 14:
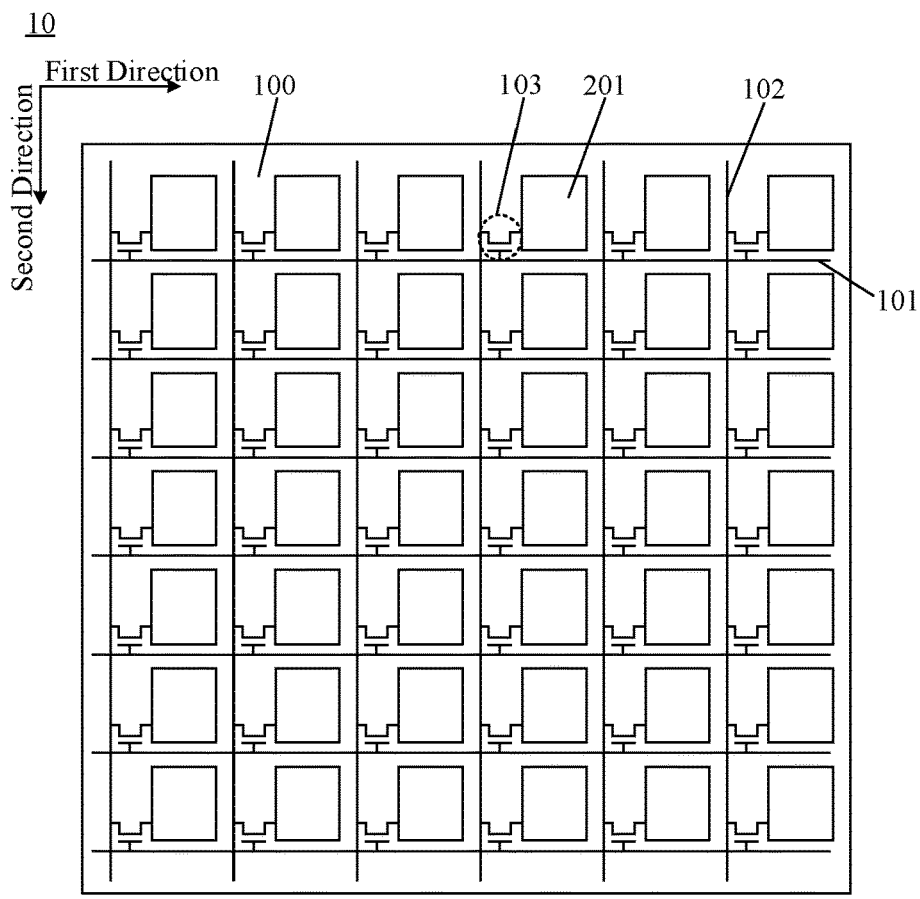
FIG. 14 is a schematic structural diagram of a substrate according to an embodiment of the present disclosure.

Optionally, as illustrated in FIG. 14, the substrate 10 includes a first substrate 100, a plurality of gate lines 101 and a plurality of data lines 102 which are arranged on the first substrate 100, the plurality of gate lines 101 extend in a first direction and sequentially arranged in a second direction and the plurality of data lines 102 extend in the second direction and sequentially arranged in the first direction. The substrate 10 further includes a plurality of thin film transistors (TFT) 103 arranged on the first substrate 100. Gate electrodes of the plurality of thin film transistors 103 located in a same row and arranged in the first direction are electrically connected to a same gate line 101. Source electrodes of the plurality of thin film transistors 103 arranged in a same column and arranged in the second direction are electrically connected to a same data line 102. The first electrode 201 in one transfer structure 20 is electrically connected to a drain electrode of one thin film transistor 103.

The thin film transistor 103 includes a source electrode, a drain electrode, an active layer, a gate electrode, and a gate insulating layer.

Here, the first substrate 100 is a glass substrate or a silicon substrate.

In addition, the second electrodes 203 of the plurality of transfer structures 20 on the substrate 10 can be electrically connected to a common electrode line.

In the embodiment of the present disclosure, the substrate 10 includes the first substrate 100, as well as the gate line 101, the data line 102, and the thin film transistor 103 that are arranged on the first substrate 100. Because the first electrode 201 in one transfer structure 20 is electrically connected to a drain electrode of a thin film transistor 103, so that the gate electrode 101, the data line 102, and the thin film transistor 103 can be individually controlled to apply a voltage to the first electrode 201 in each transfer structure 20; therefore, the plurality of transfer structures 20 can be individually controlled. In this way, it is possible to individually control whether the plurality of transfer structures 20 in the transfer device are adhered to the component 30 to be transferred.

Figure 15:
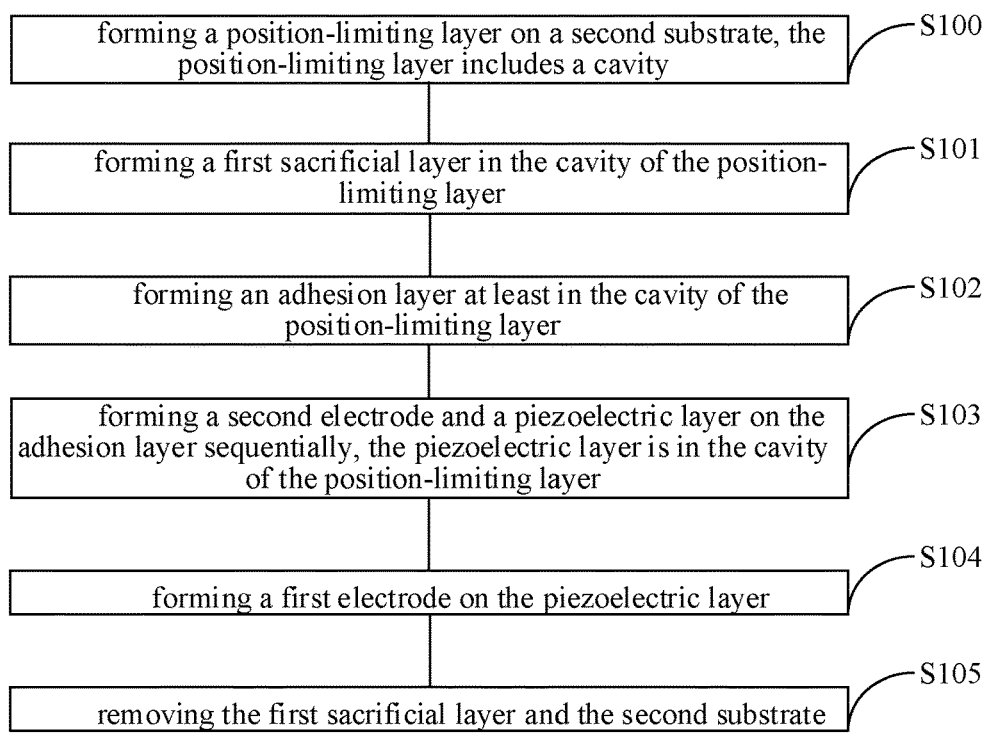
FIG. 15 is a schematic flowchart of a manufacturing method of a transfer structure according to an embodiment of the present disclosure.
Figure 16A:
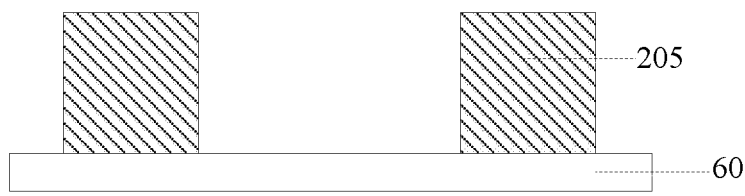
FIG. 16A is a schematic structural diagram of forming a position-limiting layer on a second substrate according to an embodiment of the present disclosure.

An embodiment of the present disclosure provides a manufacturing method of a transfer structure, which can be used to manufacture the forgoing transfer structure. The manufacturing method of the transfer structure, as illustrated in FIG. 15, includes:

S100: as illustrated in FIG. 16A, forming a position-limiting layer 205 on a second substrate 60; the position-limiting layer 205 includes a cavity.

Here, the second substrate 60 can be glass, for example. In a direction perpendicular to the second substrate 60, the cavity has an opening facing at least the second substrate 60. Of course, in the direction perpendicular to the second substrate 60, the cavity can also penetrate the position-limiting layer 205.

A process of forming the position-limiting layer 205 on the second substrate 60 can be, for example: forming a position-limiting layer film on the second substrate 60 and patterning the position-limiting layer film to form the position-limiting layer 205. Here, the patterning includes mask exposure, development, and etching processes.

Figure 16B:
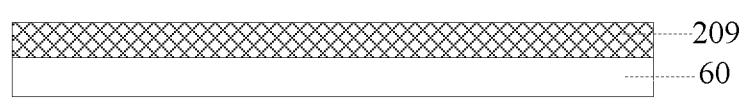
FIG. 16B is a schematic structural diagram of forming a second sacrificial layer on a second substrate according to an embodiment of the present disclosure.

In some embodiments, before S100, as illustrated in FIG. 16B, a second sacrificial layer 209 is formed on the second substrate 60.

Figure 17:
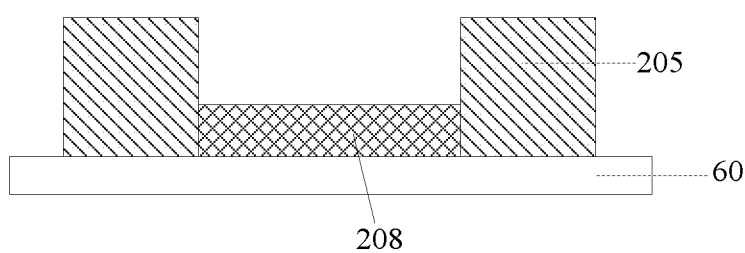
FIG. 17 is a schematic structural diagram of forming a first sacrificial layer in a cavity of a position-limiting layer according to an embodiment of the present disclosure.

S101: as illustrated in FIG. 17, forming a first sacrificial layer 208 in the cavity of the position-limiting layer 205.

Figure 18:
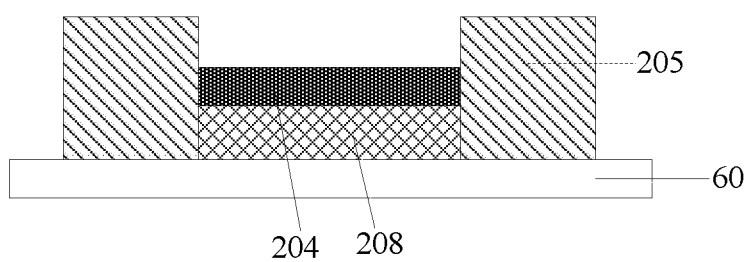
FIG. 18 is a schematic structural diagram of forming an adhesion layer on a first sacrificial layer according to an embodiment of the present disclosure.
Figure 19:
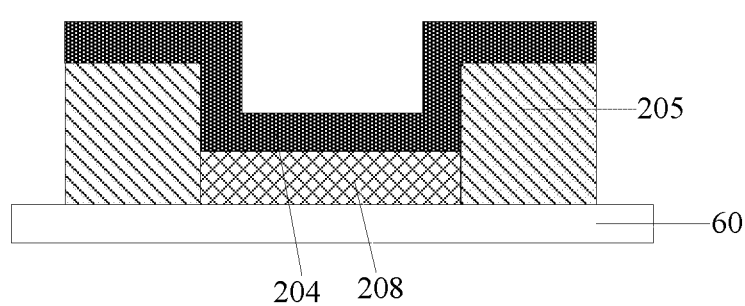
FIG. 19 is another schematic structural diagram of forming an adhesion layer on a first sacrificial layer according to an embodiment of the present disclosure.

S102: as illustrated in FIGS. 18 and 19, forming an adhesion layer 204 at least in the cavity of the position-limiting layer 205.

Here, it can be that, as illustrated in FIG. 18, the adhesion layer 204 is formed only in the cavity of the position-limiting layer 205; or it can also be that, as illustrated in FIG. 19, the adhesion layer 204 is not only formed in the cavity of the position-limiting layer 205 but also extends to a side of the position-limiting layer 205 away from the second substrate 60.

Figure 20:
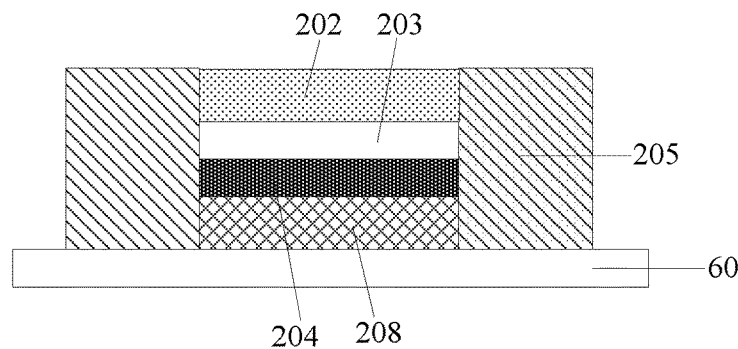
FIG. 20 is a schematic structural diagram of sequentially forming a second electrode and a piezoelectric layer in a cavity of a position-limiting layer according to an embodiment of the present disclosure.

S103: as illustrated in FIG. 20, forming a second electrode 203 and a piezoelectric layer 202 on the adhesion layer 204 sequentially; the piezoelectric layer 202 is located in the cavity of the position-limiting layer 205.

Here, it can be that, as illustrated in FIG. 20, the entirety of the second electrode 203 is located in the cavity of the position-limiting layer 205, it can also be that, the second electrode 203 is partially located in the cavity of the position-limiting layer 205, and is partially extended to the side of the position-limiting layer 205 away from the second substrate 60.

Before S103, as illustrated in FIGS. 13A and 13B, a protective layer 207 can also be formed on the adhesion layer 204 to separate the adhesion layer 204 and the second electrode 203 for protection.

Figure 21:
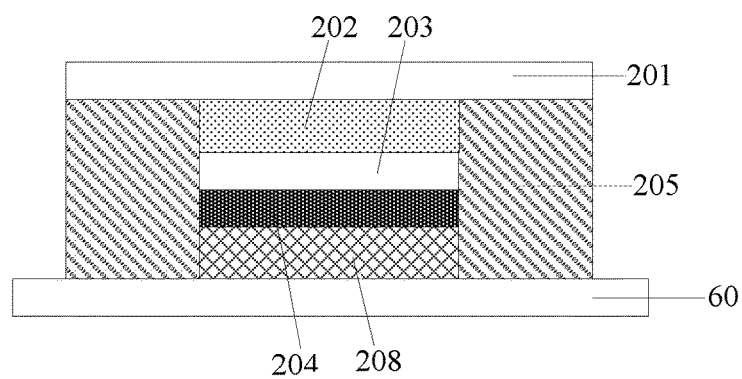
FIG. 21 is a schematic structural diagram of forming a first electrode on a piezoelectric layer according to an embodiment of the present disclosure.

S104: as illustrated in FIG. 21, forming a first electrode 201 on the piezoelectric layer 202.

Here, it can be that there is no overlapping area between an orthographic projection of the first electrode 201 on the second substrate 60 and an orthographic projection of the position-limiting layer 205 on the second substrate 60; or it can also be that there is an overlapping area between the orthographic projection of the first electrode 201 on the second substrate 60 and the orthographic projection of the position-limiting layer 205 on the second substrate 60.

Before S104, as illustrated in FIG. 13B, an elastic layer 211 can also be formed on the first electrode 201, and the elastic layer 211 functions as carrying the transfer structure 20.

S105: as illustrated in FIG. 2, removing the first sacrificial layer 208 and the second substrate 60.

Here, the first sacrificial layer 208 and the second substrate 60 can be removed by laser.

In a case that the second sacrificial layer 209 is formed on the second substrate 60, the manufacturing method of the transfer structure 20 described above further includes: removing the second sacrificial layer 209 while removing the first sacrificial layer 208 and the second substrate 60. Compared with directly forming the position-limiting layer 205 on the second substrate 60, in the embodiment of the present disclosure, the second sacrificial layer 209 is first formed on the second substrate 60, and then the position-limiting layer 205 is formed, which is beneficial to separate the second substrate 60 from the position-limiting layer 205 when the second substrate 60 is removed.

An embodiment of the present disclosure provides a manufacturing method of a transfer structure 20. The manufacturing method of the transfer structure 20 has the same beneficial effects as the forgoing transfer structure 20. Because the forgoing embodiments have already described the structure and beneficial effects of the transfer structure 20 in details, so the details are not repeated herein.

Figure 23:
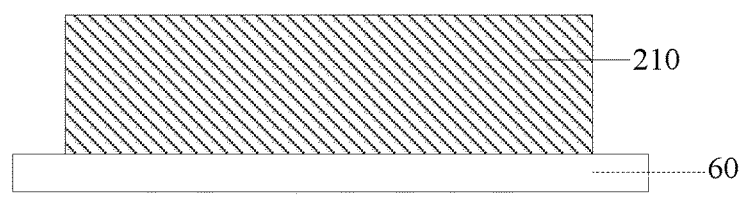
FIG. 23 is a schematic structural diagram of forming a position-limiting layer film on a second substrate according to an embodiment of the present disclosure.

Optionally, S100 includes:

S200: as illustrated in FIG. 23, forming a position-limiting layer film 210 on the second substrate 60.

Figure 24:
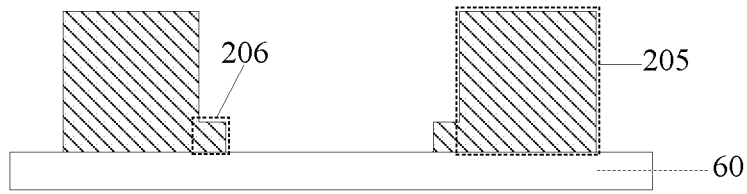
FIG. 24 is a schematic structural diagram of forming a position-limiting layer on a second substrate and a protruding structure arranged on a sidewall of a cavity of a position-limiting layer according to an embodiment of the present disclosure.

S201: as illustrated in FIG. 24, patterning the position-limiting layer film 210 to form a position-limiting layer 205 on the second substrate 60, and simultaneously forming a protruding structure 206 on a sidewall of a cavity of the position-limiting layer 205.

In the embodiment of the present disclosure, the position-limiting layer 205 and the protruding structure 206 can be formed at the same time through one patterning process, which simplifies the manufacturing process of the transfer structure 20. In addition, the protruding structure 206 is formed on the sidewall of the cavity of the position-limiting layer 205, and the protruding structure 206 can prevent the component 30 to be transferred from entering into the cavity of the layer 205 while the adhesion layer 204 shrinks back into the cavity of the position-limiting layer 205, thereby ensuring that the adhesion layer 204 is separated from the component 30 to be transferred.

Figure 22:
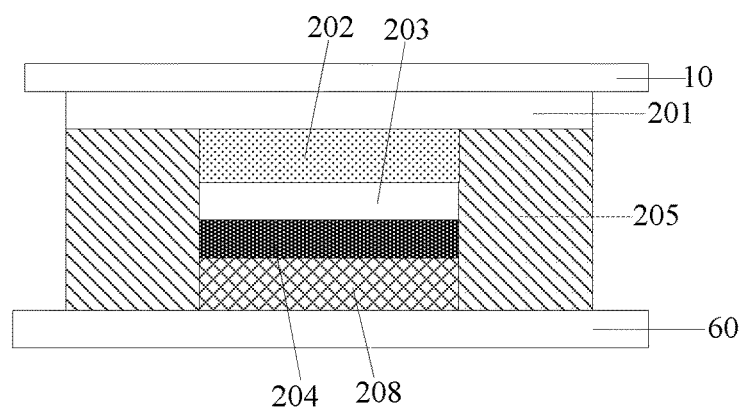
FIG. 22 is a schematic structural diagram of forming a substrate on a first electrode according to an embodiment of the present disclosure.

An embodiment of the present disclosure further provides a manufacturing method of a transfer device. As illustrated in FIG. 22, the manufacturing method includes forming a plurality of manufactured transfer structures 20 on a substrate 10. It should be noted that, in order to simplify the figure, FIG. 22 only illustrates that one transfer structure 20 is formed on the substrate 10.

Figure 25:
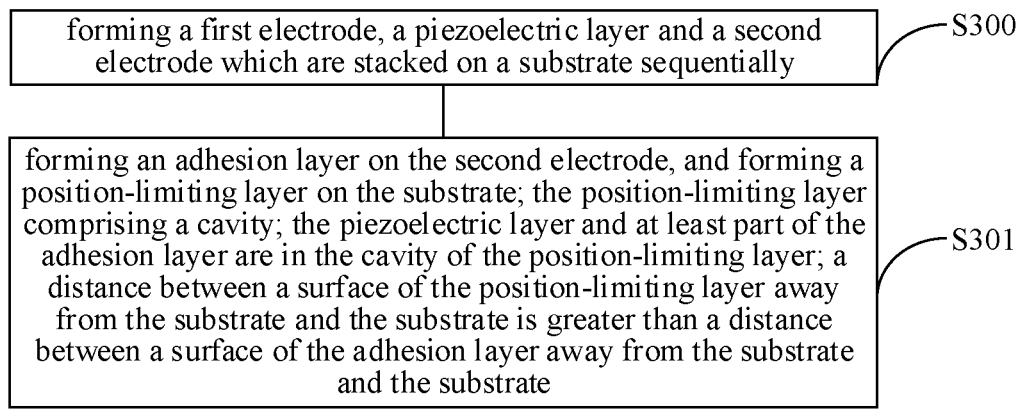
FIG. 25 is a schematic flowchart of a manufacturing method of a transfer device according to an embodiment of the present disclosure.
Figure 26:
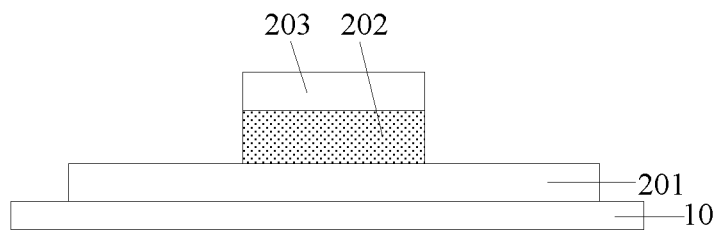
FIG. 26 is a schematic structural diagram of forming a first electrode, a piezoelectric layer, and a second electrode on a substrate according to an embodiment of the present disclosure.

The embodiment of the present disclosure further provides another manufacturing method of a transfer device, which can be used to manufacture the forgoing transfer device. The manufacturing method of the transfer device, as illustrated in FIG. 25, includes:

S300: as illustrated in FIG. 26, forming a first electrode 201, a piezoelectric layer 202, and a second electrode 203 which are stacked on a substrate 10 sequentially.

S301: as illustrated in FIGS. 2, 3, 4 and 5, forming an adhesion layer 204 on the second electrode 203, and forming a position-limiting layer 205 on the substrate 10; the position-limiting layer 205 includes a cavity. The piezoelectric layer 202 and at least part of the adhesion layer 204 are located in the cavity of the position-limiting layer 205. A distance between a surface of the position-limiting layer 205 away from the substrate 10 and the substrate 10 is greater than a distance between a surface of the adhesion layer 204 away from the substrate 10 and the substrate 10.

Here, it can be that, the adhesion layer 204 can first be formed on the second electrode 203, and then the position-limiting layer 205 can be formed on the substrate 10; or it can also be that, the position-limiting layer 205 can first be formed on the substrate 10, and then the adhesion layer 204 can be formed on the second electrode 203.

When the adhesion layer 204 is first formed on the second electrode 203, and then the position-limiting layer 205 is formed on the substrate 10, the adhesion layer 204 formed on the second electrode 203 can only be located in the cavity of the position-limiting layer 205 formed later, or the adhesion layer 204 can also be partially located in the cavity of the position-limiting layer 205 formed later and partially located between the position-limiting layer 205 and the substrate 10. When the position-limiting layer 205 is first formed on the substrate 10, and then the adhesion layer 204 is formed on the second electrode 203, the entirety of the adhesion layer 204 is located in the cavity of the position-limiting layer 205.

An embodiment of the present disclosure provides a manufacturing method of a transfer structure 20. The manufacturing method of the transfer structure 20 has the same beneficial effects as the forgoing transfer structure 20. Because the forgoing embodiments have already described the structure and beneficial effects of the transfer structure 20 in details, so the details are not repeated herein.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. A transfer structure, comprising: a first electrode, a piezoelectric layer, a second electrode and an adhesion layer which are sequentially stacked on a substrate; the first electrode and the second electrode being insulated from each other;
the transfer structure further comprises a position-limiting layer, and the position-limiting layer comprises a cavity;
wherein the piezoelectric layer and at least part of the adhesion layer are in the cavity of the position-limiting layer; and in a direction perpendicular to the substrate, a distance between a surface of the position-limiting layer away from the substrate and the substrate is greater than a distance between a surface of the adhesion layer away from the substrate and the substrate, and at least part of the at least part of the adhesion layer located in the cavity is further away from the first electrode than the piezoelectric layer.

2. The transfer structure according to claim 1, wherein, the transfer structure further comprises a protruding structure on a sidewall of the cavity of the position-limiting layer.

3. The transfer structure according to claim 2, wherein in a direction perpendicular to the substrate, the protruding structure is located on a side of the adhesion layer away from the substrate.

4. The transfer structure according to claim 3, wherein, in the direction perpendicular to the substrate, a surface of the protruding structure away from the substrate and the surface of the position-limiting layer away from the substrate are in a same plane.

5. The transfer structure according to claim 2, wherein the position-limiting layer and the protruding structure are integrally formed.

6. The transfer structure according to claim 1, wherein, in the direction perpendicular to the substrate, the cavity has an opening facing at least a side away from the substrate.

7. The transfer structure according to claim 1, wherein the transfer structure further comprises a protective layer between the second electrode and the adhesion layer.

8. The transfer structure according to claim 1, wherein the transfer structure further comprises an elastic layer on a side of the first electrode away from the piezoelectric layer.

9. A transfer device, comprising a substrate and a plurality of transfer structures on the substrate according to claim 1.

10. The transfer device according to claim 9, wherein the substrate comprises a first substrate, a plurality of gate lines and a plurality of data lines which are on the first substrate, the plurality of gate lines extend in a first direction and are sequentially arranged in a second direction, and the plurality of data lines extend in the second direction and are sequentially arranged in the first direction;
the substrate further comprises a plurality of thin film transistors on the first substrate; gate electrodes of the plurality of thin film transistors in a same row and arranged in the first direction are electrically connected to a same gate line; and source electrodes of the plurality of thin film transistors in a same column and arranged in the second direction are electrically connected to a same data line;
one first electrode in one transfer structure is electrically connected to one drain electrode of the thin film transistor.

11. A manufacturing method of a transfer structure, comprising:
forming a position-limiting layer on a second substrate, wherein the position-limiting layer comprises a cavity;
forming a first sacrificial layer in the cavity of the position-limiting layer;
forming an adhesion layer at least in the cavity of the position-limiting layer;
forming a second electrode and a piezoelectric layer on the adhesion layer sequentially, wherein the piezoelectric layer is in the cavity of the position-limiting layer;
forming a first electrode on the piezoelectric layer; and
removing the first sacrificial layer and the second substrate, wherein at least part of the adhesion layer located in the cavity is further away from the first electrode than the piezoelectric layer.

12. The manufacturing method according to claim 11, wherein in a direction perpendicular to the second substrate, the cavity has an opening facing at least the second substrate.

13. The manufacturing method according to claim 11, wherein forming the position-limiting layer on the second substrate comprises:
   forming a position-limiting layer film on the second substrate;
   patterning the position-limiting layer film to form the position-limiting layer on the second substrate, and simultaneously forming a protruding structure on a sidewall of the cavity of the position-limiting layer.

14. The manufacturing method according to claim 11, further comprising: before forming the second electrode and the piezoelectric layer on the adhesion layer sequentially, forming a protective layer on the adhesion layer.

15. The manufacturing method according to claim 11, further comprising: after forming the first electrode on the piezoelectric layer, forming an elastic layer on the first electrode.

16. A manufacturing method of a transfer device, comprising:
   forming a first electrode, a piezoelectric layer and a second electrode which are stacked on a substrate sequentially;
   forming an adhesion layer on the second electrode, and forming a position-limiting layer on the substrate; the position-limiting layer comprising a cavity; wherein the piezoelectric layer and at least part of the adhesion layer are in the cavity of the position-limiting layer; a distance between a surface of the position-limiting layer away from the substrate and the substrate is greater than a distance between a surface of the adhesion layer away from the substrate and the substrate, wherein at least part of the adhesion layer located in the cavity is further away from the first electrode than the piezoelectric layer.

* * * * *